US012689365B2

(12) United States Patent
Deen et al.

(10) Patent No.: US 12,689,365 B2
(45) Date of Patent: Jul. 21, 2026

(54) HIGH-VOLTAGE GLITCH-SUPPRESSED SEMICONDUCTOR SWITCH FOR QUANTUM OBJECT CONFINEMENT APPARATUS

(71) Applicant: Quantinuum, LLC, Broomfield, CO (US)

(72) Inventors: David Deen, Broomfield, CO (US); Leonardo Ascarrunz, Lafayette, CO (US); Paul M. Werking, Charlotte, NC (US); Garrett Shaffer, Charlotte, NC (US)

(73) Assignee: Quantinuum, LLC, Broomfield, CO (US)

( * ) Notice: Subject to any disclaimer, the term of this patent is extended or adjusted under 35 U.S.C. 154(b) by 17 days.

(21) Appl. No.: 18/817,955

(22) Filed: Aug. 28, 2024

(65) Prior Publication Data

US 2025/0112632 A1      Apr. 3, 2025

Related U.S. Application Data

(60) Provisional application No. 63/586,214, filed on Sep. 28, 2023.

(51) Int. Cl.
*H03K 17/16*          (2006.01)
*G06N 10/40*          (2022.01)

(52) U.S. Cl.
CPC ........... *H03K 17/162* (2013.01); *G06N 10/40* (2022.01)

(58) Field of Classification Search
CPC .............................. H03K 17/162; G06N 10/40
See application file for complete search history.

(56) References Cited

U.S. PATENT DOCUMENTS

| | | | |
|---|---|---|---|
| 8,232,827 B2 | 7/2012 | Sagae et al. | |
| 11,250,777 B2 * | 2/2022 | Hudson | ............... G09G 3/3233 |
| 11,368,013 B2 | 6/2022 | Li et al. | |
| 11,595,029 B2 | 2/2023 | Kurachi | |
| 11,876,092 B2 | 1/2024 | Deen et al. | |
| 11,929,743 B2 | 3/2024 | Deen et al. | |

(Continued)

FOREIGN PATENT DOCUMENTS

| | | | | |
|---|---|---|---|---|
| CN | 117118233 A | * | 11/2023 | ............ H02M 3/158 |

OTHER PUBLICATIONS

ISA/237—Written Opinion of the IPEA Mailed on Apr. 3, 2025 for WO Application No. PCT/US24/048563, 5 page (s).

(Continued)

*Primary Examiner* — Lincoln D Donovan
*Assistant Examiner* — Amit R Bhatia
(74) *Attorney, Agent, or Firm* — Alston & Bird LLP

(57)          ABSTRACT

A quantum object confinement apparatus comprising one or more high-voltage semiconductor switches is provided. Each switch comprises a transmission gate portion, a gate driver portion, a current distribution portion, and a logic enable portion. The transmission gate portion comprises two transistors connected in series source-to-source or drain-to-drain. The gate driver portion detects a voltage at the switch input terminal and the switch output terminal and applies a bias voltage to the gates of the two transistors of the transmission gate portion that is a predetermined amount above a lesser or a greater of the voltage at the switch input terminal or the voltage at the switch output terminal.

20 Claims, 7 Drawing Sheets

(56) References Cited

U.S. PATENT DOCUMENTS

Figure 1:
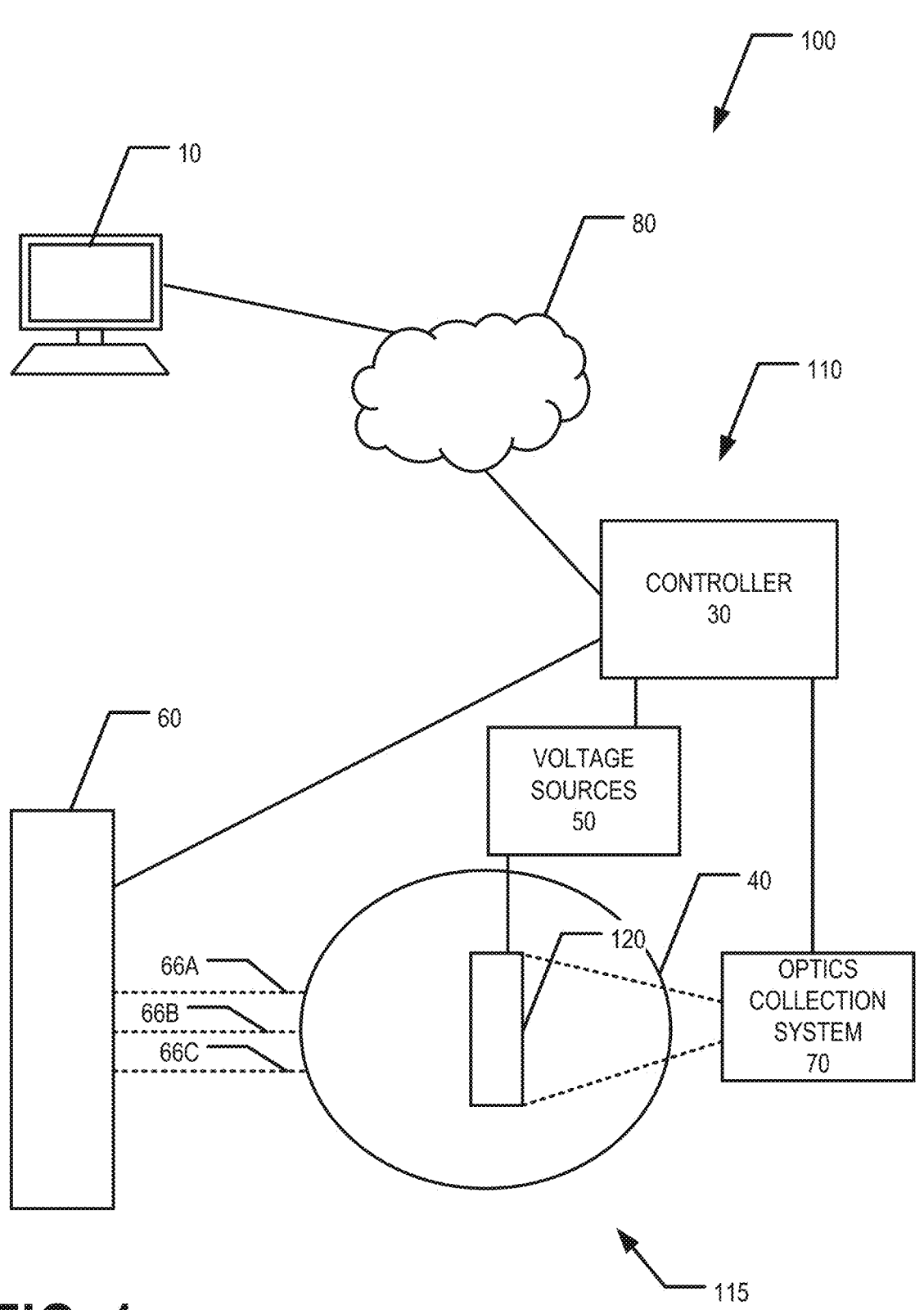

| | | | |
|---|---|---|---|
| 2014/0327495 A1 | 11/2014 | He et al. | |
| 2015/0014779 A1 * | 1/2015 | Jennings et al. | |
| 2022/0037313 A1 * | 2/2022 | Deen .................. | H01L 25/0657 |
| 2023/0026029 A1 * | 1/2023 | Deen .................... | H03K 17/102 |
| 2023/0218249 A1 * | 7/2023 | Hazu .................... | G01T 1/2985 |
| | | | 250/361 R |

OTHER PUBLICATIONS

Outgoing—ISA/210—International Search Report Mailed on Apr. 3, 2025 for WO Application No. PCT/US24/048563, 3 page(s).
U.S. Provisional Utility Patent Application for "Conditional Operations in Quantum Object Confinement Apparatus Using Broadcasted Control Voltage Signals", unpublished (filed Oct. 11, 2022), Christopher E. Langer (Inventor), Quantinuum LLC (Applicant), U.S. Appl. No. 63/379,040.

* cited by examiner

600

HIGH-VOLTAGE GLITCH-SUPPRESSED SEMICONDUCTOR SWITCH FOR QUANTUM OBJECT CONFINEMENT APPARATUS

CROSS-REFERENCE TO RELATED APPLICATIONS

This application claims priority to and the benefit of U.S. Provisional Patent Application Ser. No. 63/586,214, filed Sep. 28, 2023, and titled "HIGH-VOLTAGE GLITCH-SUPPRESSED SEMICONDUCTOR SWITCH FOR QUANTUM OBJECT CONFINEMENT APPARATUS," which is incorporated herein by reference in its entirety.

TECHNICAL FIELD

Various embodiments relate to a high-voltage semiconductor switch, such as those used in electrical switching circuits of a quantum computer to control the flow of signals to an ion trap electrode.

BACKGROUND

Electrical switching circuits using transistors, such as field-effect transistors (FETs), have practical limitations which may limit the environment in which such electrical switch circuits may be used. Such limitations may be due to the composition of the electrical switching circuit the FET is used in or may be due to the manufacture of the FET. For example, electrical circuits for use in various specialty applications, such as for use in large-scale quantum computers, may use, among other things, higher voltages than traditional circuits. For example, traditional electrical switching circuits have used, for example, CMOS technology that has an intrinsic upper limit at five volts, which is not capable of meeting the operational criteria the operational criteria of, for example, quantum computers that may require high voltages. The operational criteria of electrical circuits may also have heightened requirements, such as requiring the semiconductor switches to meet specific operational criteria including but not limited to noise requirements or delay requirements. Through applied effort, ingenuity, and innovation, many deficiencies of prior semiconductor switches have been solved by developing solutions that are structured in accordance with the embodiments of the present invention, many examples of which are described in detail herein.

BRIEF SUMMARY OF EXAMPLE EMBODIMENTS

Example embodiments provide quantum object confinement apparatuses, systems comprising quantum object confinement apparatuses, and methods for routing and sorting quantum objects confined by quantum object confinement apparatuses. Example embodiments also provide apparatuses, systems, methods, computer program products and/or the like for high-voltage semiconductor switches. For example, various embodiments provide apparatuses, systems, methods, computer program products, and/or the like for use in a quantum computer, including for use as a high-voltage semiconductor switch for ion trap electrode control in switching networks of the quantum computer. The high-voltage semiconductor switch may also be used in other applications that use a high-voltage semiconductor switches, as is discussed herein.

In an example embodiment, and according to an aspect of the present disclosure, a quantum object confinement apparatus comprises one or more electrode sequences and one or more high-voltage semiconductor switches. Each electrode sequence comprises a respective plurality of control electrodes configured to control the electric potential in a respective trapping region of one or more trapping regions of the quantum object confinement apparatus. A first switchable control electrode of one or more switchable control electrodes of the respective plurality of control electrodes is configured to be switchably in electrical communication with a respective selected switchable control voltage source of two or more switchable control voltage sources. Each electrode sequence of the one or more electrode sequences is associated with a respective switch of the one or more switches and the respective switch is configured to control switching of the electrical communication of the one or more switchable control electrodes with the respective selected switchable control voltage sources of the two or more switchable voltage sources. Each of the one or more switches comprises a transmission gate portion, a gate driver portion, a current distribution portion, and a logic enable portion. The transmission gate portion comprises two transistors connected in series source-to-source or drain-to-drain. These transistors may be termed "pass transistors." The transmission gate portion has a switch input terminal at one end and a switch output terminal at an opposite end. Each of the two transistors have a gate, a source, and a drain. The gate driver portion detects a voltage at each of the switch input terminal and the switch output terminal and applies a bias voltage to the gates of the two transistors of the transmission gate portion. The applied bias voltage is a predetermined amount above a lesser or a greater of the voltage at the switch input terminal or the voltage at the switch output terminal. The current distribution portion provides a selectable current to each of a first drive line connected to the gates of the two transistors of the transmission gate portion and a second drive line. The logic enable portion controls the selectable current to each of the first and second drive lines in response to first and second control signals received by the logic enable portion. The logic enable portion controls the selectable current to each of the first and second drive lines in response to the first control signal received by the logic enable portion such that a first voltage is applied to the gates of the two transistors of the transmission gate portion to turn the respective switch on such that a current flows through the two transistors of the transmission gate portion from the switch input terminal to the switch output terminal. The logic enable portion controls the selectable current to each of the first and second drive lines in response to the second control signal received by the logic enable portion such that a second voltage is applied to the gates of the two transistors of the transmission gate portion to turn the respective switch off such that substantially no current flows through the two transistors of the transmission gate portion from the switch input terminal to the switch output terminal.

In an example embodiment, the two transistors of the transmission gate portion of each of the one or more switches are both a same type and size of transistor.

In an example embodiment, the two transistors of the transmission gate portion of each of the one or more switches are both a p-type double-diffused metal-oxide-semiconductor (DMOS) transistor or both an n-type DMOS transistor.

In an example embodiment, each of the one or more switches further comprises glitch cancelation circuitry connected between the switch output terminal and the second drive line.

In an example embodiment, the glitch cancelation circuitry comprises a balance capacitor to balance a gate capacitance of the transmission gate portion.

In an example embodiment, the balance capacitor has a capacitance value of about one-half the gate capacitance of the transmission gate portion.

In an example embodiment, the logic enable portion controls the selectable current to each of the first and second drive lines based on one or more five volt input signals.

In an example embodiment, the current distribution portion provides a constant current to the gate driver portion.

According to another aspect of the present disclosure, a system comprises two or more switchable control voltage sources, a controller, and a quantum object confinement apparatus as described above. Each switchable control voltage source is configured to generate a respective switchable control voltage signal. The controller is configured to control operation of each of the two or more switchable control voltage sources, and with which of the two or more switchable control voltage sources the set of one or more switchable control electrodes are respectively in electrical communication.

According to another aspect of the present disclosure, a quantum computer comprises two or more switchable control voltage sources, a controller, and a quantum object confinement apparatus as described above. Each switchable control voltage source is configured to generate a respective switchable control voltage signal. The controller is configured to control operation of each of the two or more switchable control voltage sources, and with which of the two or more switchable control voltage sources the set of one or more switchable control electrodes are respectively in electrical communication.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 is a schematic diagram illustrating an example quantum computing system comprising a quantum system controller according to an example embodiment.

Figure 2:
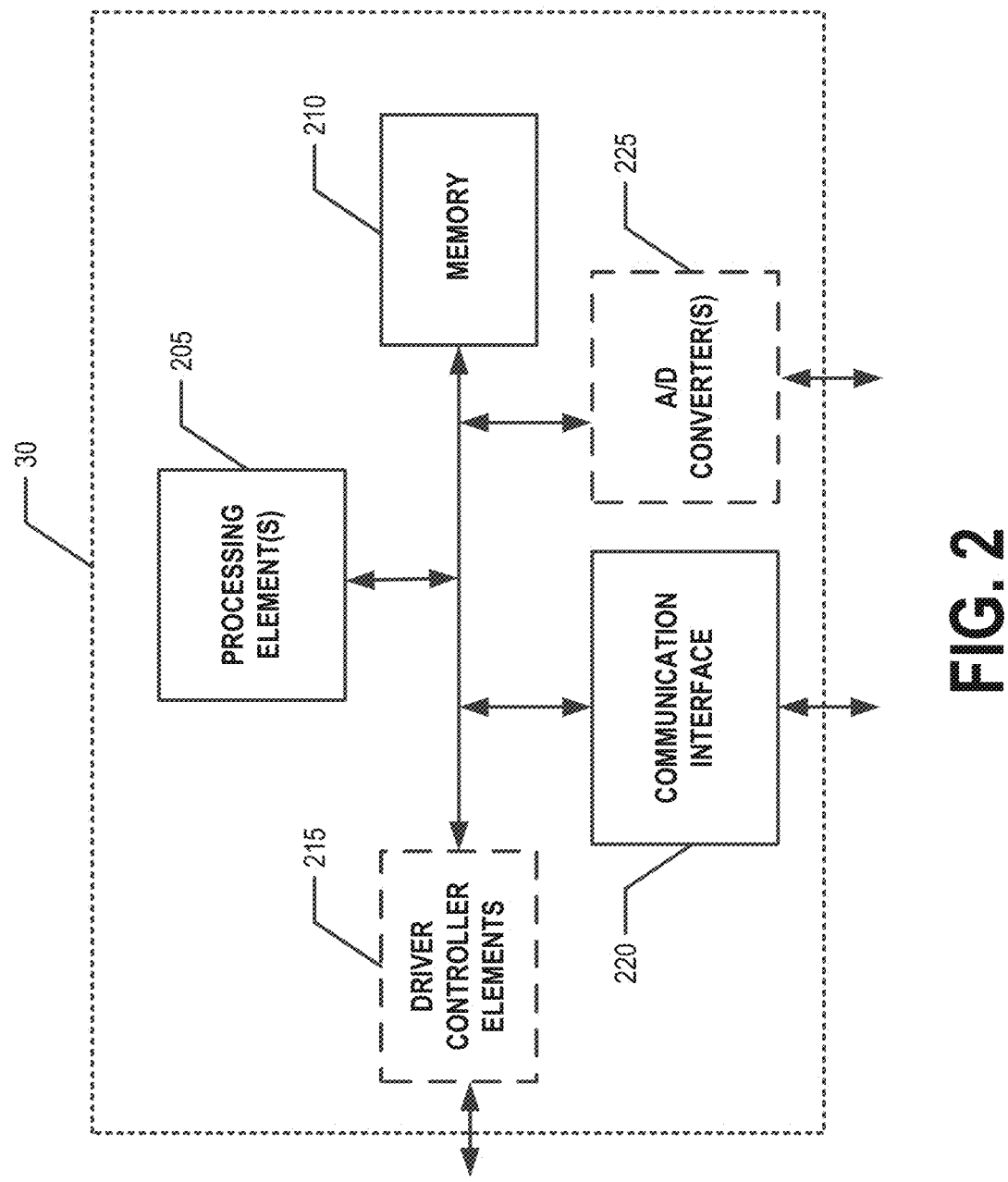

FIG. 2 provides a schematic diagram of an example quantum system controller of a quantum computer.

Figure 3:
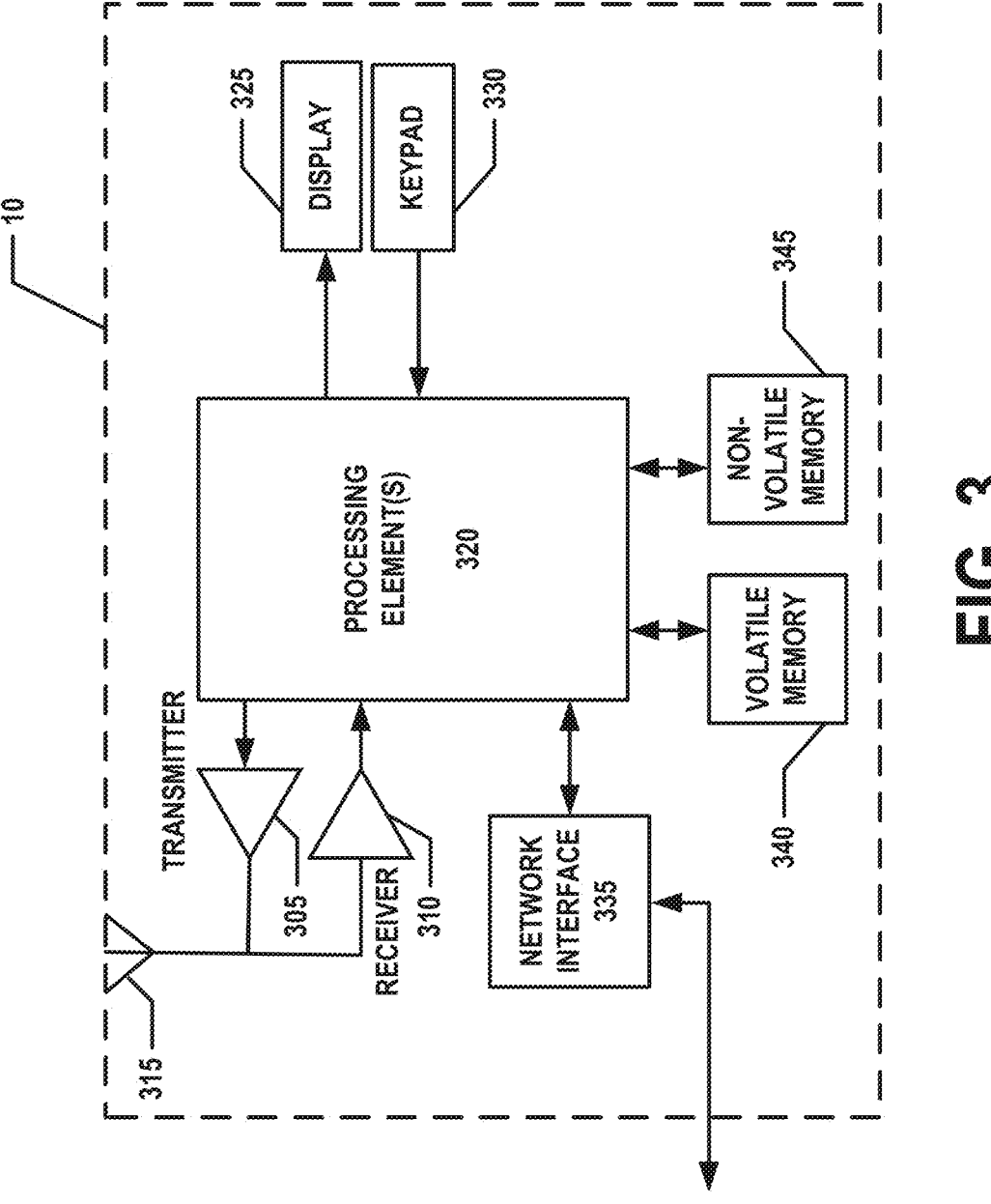

FIG. 3 provides a schematic diagram of an example computing entity of a quantum computer system that may be used in accordance with an example embodiment.

Figure 4A:
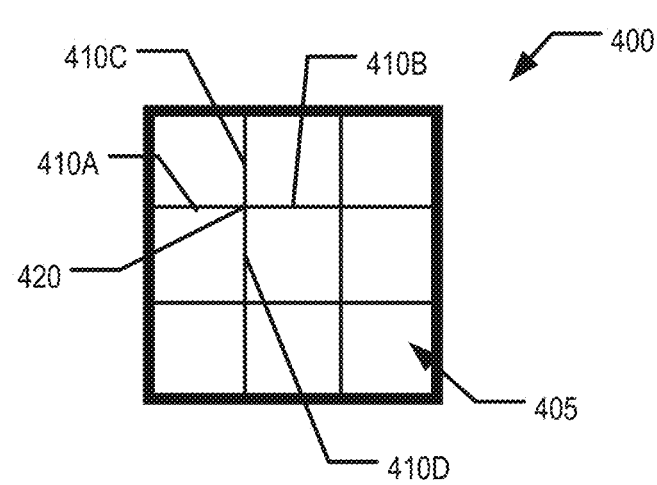

FIG. 4A provides a top view of at least a portion of an example quantum object confinement apparatus that may be used in an example embodiment.

Figure 4B:
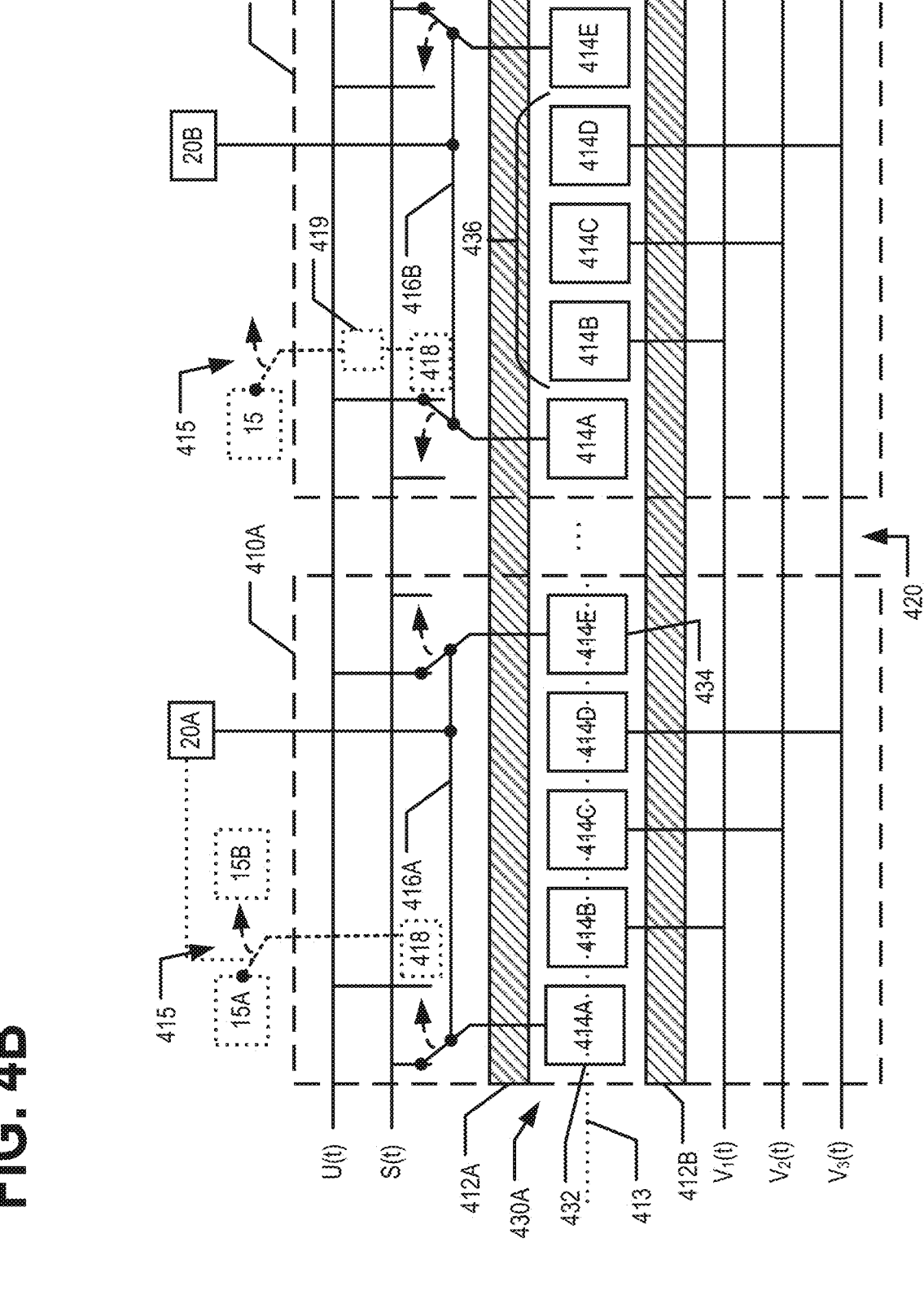

FIG. 4B provides a schematic diagram of the electrode sequences corresponding to two linear trapping regions, in accordance with an example embodiment.

Figure 5:
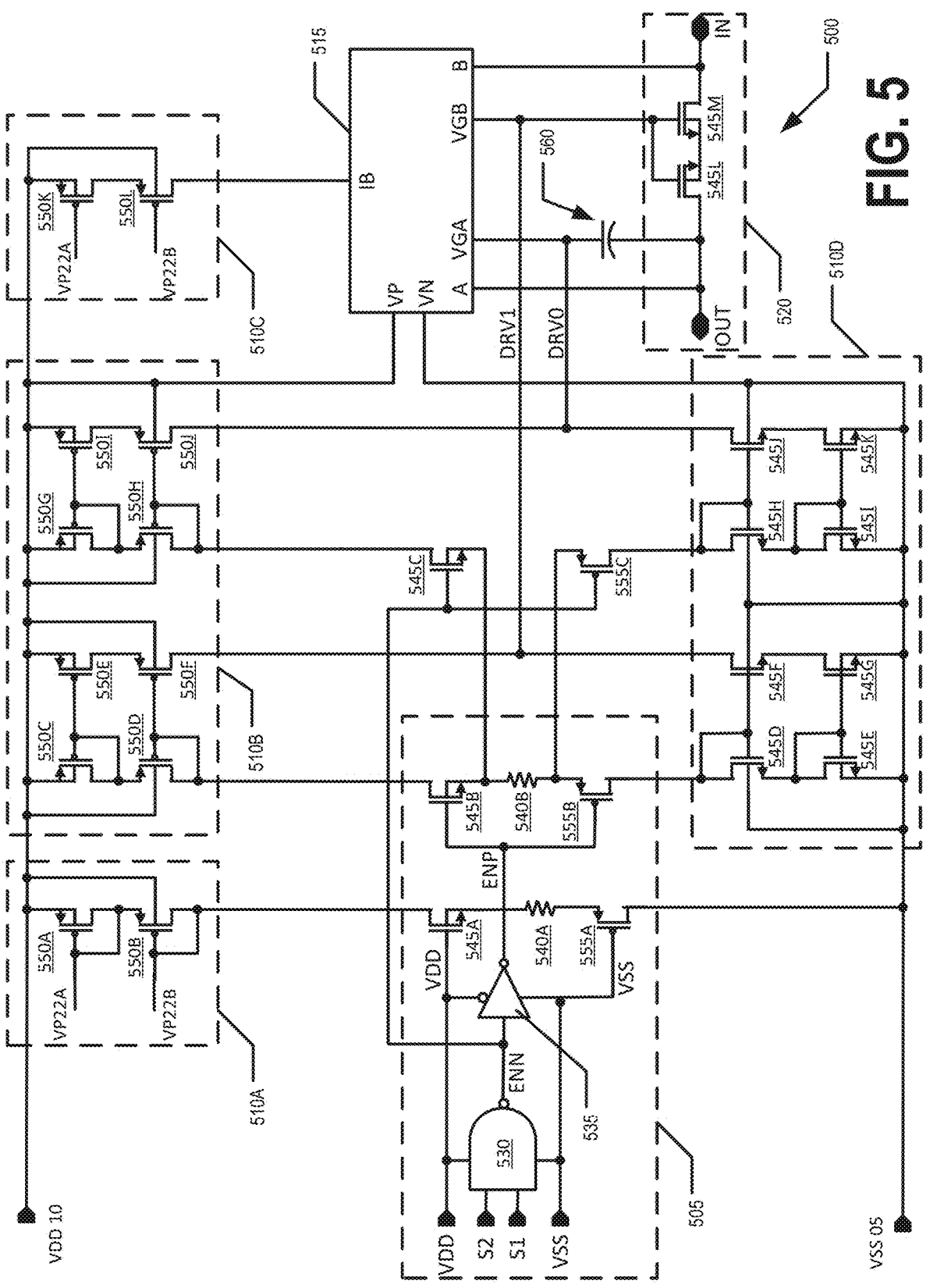

FIG. 5 provides a schematic diagram of a high-voltage semiconductor switch that may be used in accordance with an example embodiment.

Figure 6:
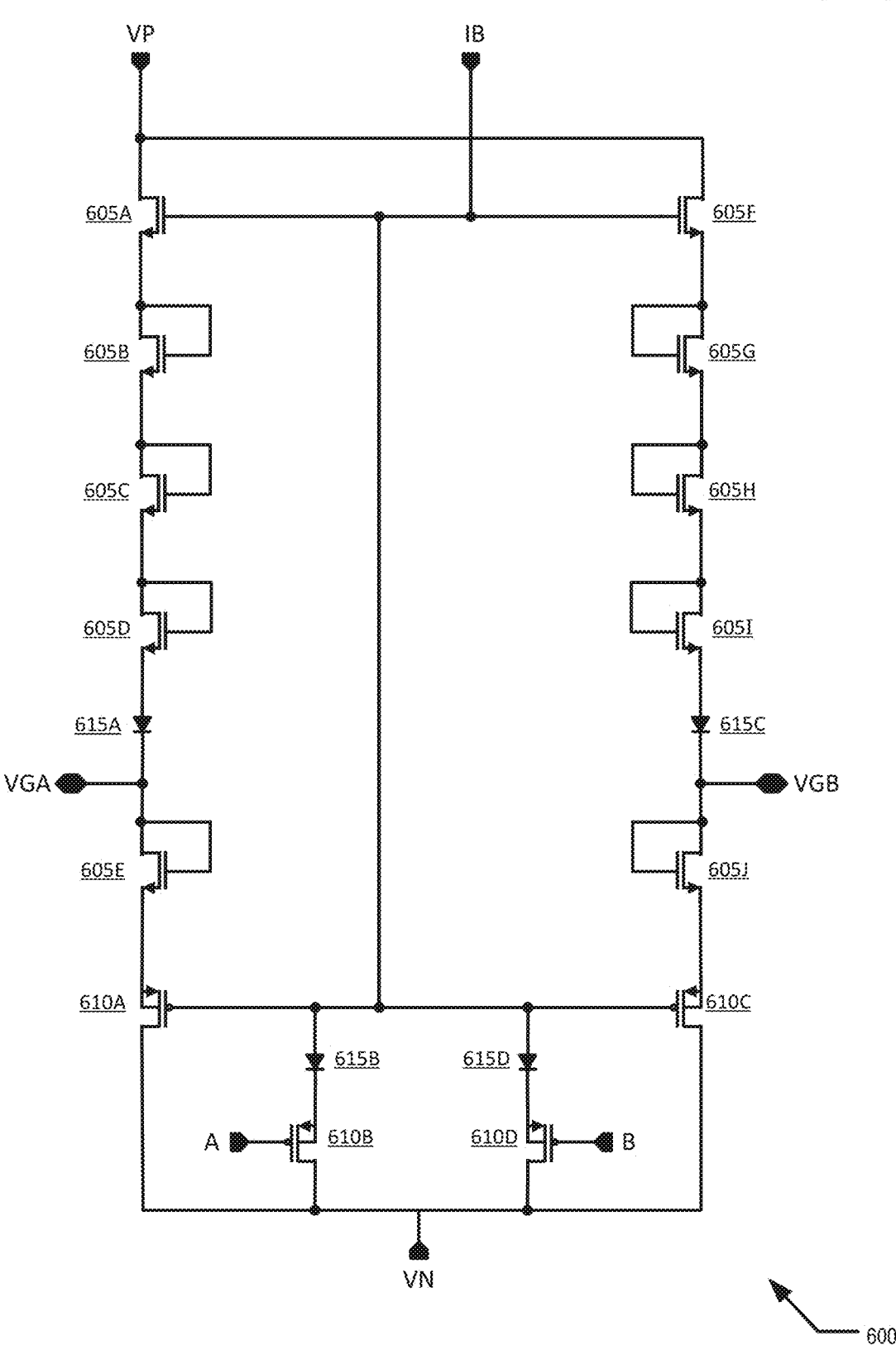

FIG. 6 provides a schematic diagram of a portion of a switch subcircuit that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

Example embodiments provide systems, apparatuses, methods, computer program products, and/or the like for a high-voltage semiconductor switch. For example, various embodiments provide systems, apparatuses, methods, computer program products, and/or the like for the design and use of a high-voltage semiconductor switch for use in a quantum computing system, including being in a cryostat of a quantum computing system. In various embodiments, the high-voltage semiconductor switch may be comprised of a plurality of switch subcircuits, some of which may be comprised of a plurality of FETs connected as described herein.

Electrical circuits that control information flow via electrical signals may include one or more high-voltage semiconductor switches. In various embodiments, the high-voltage semiconductor switch is, as described further herein, configured to work with and/or operate at higher voltages than prior art switches. The increased voltage tolerance and/or operating range of the high-voltage semiconductor switch disclosed herein is due at least in part to the configuration of the electrical components comprising the switch, including but not limited to the use of a transmission gate switch comprising two back-to-back transistors of the same type and same polarity that together operate as a single, equivalent transistor and a gate driver subcircuit which limits the voltage that goes to the gate of the transmission gate switch (the transmission gate switch will sometimes be described herein as having a singular gate since the two transistors of the transmission gate switch operate as a single, compound transistor).

Prior art semiconductor switches have failed to operate when voltages are applied greater than +/−5 V while the high-voltage semiconductor switch described herein may operate at voltages exceeding the +/−5 V range, while also providing additional benefits described here. In various embodiments, the high-voltage semiconductor switches may be used to switch on and off signals using voltages having magnitudes of 17 V (e.g., +/−20V), which may be used to drive loads requiring such voltages. In various embodiments, such electrical circuits include one or more high-voltage semiconductor switches that are used to control information flow to ion-traps of quantum computing systems. While not exclusive to quantum computing systems, the requirements and benefits of a high-voltage semiconductor switch allowing for the distribution of signals similar to a logic gate may be demonstrated with embodiments related to quantum computing system. As described in various embodiments herein, the high-voltage semiconductor switch may be comprised of transistors, such as field-effect transistors (FETs), and may be controlled by in a manner similar to a logic signal. Thus, as described further herein, the high-voltage semiconductor switches comprised of FETs may be used as a switch to control high-voltage signals.

Electrical switching circuits using transistors, such FETs, have practical limitations which may include limits due to the environment such circuits are used in. For example, in embodiments used in quantum computing systems, electrical switching circuits may be located in the cryostat or vacuum chamber, with may require the circuits to operate at low temperatures. Such limitations may also be due to the composition of the electrical circuit the FET is used in or may be due to the manufacture of the FET. For example, electrical circuits of switching networks, such as those in large-scale quantum computers, may use higher voltages than traditional circuits, such as greater than +/−5V. The operational criteria of these electrical circuits may also have heightened requirements, including requiring the semiconductor switches in these electrical circuit to meet specific operational criteria, including but not limited to temperature requirements, noise requirements, and/or delay requirements. Thus, a high-voltage semiconductor switch may be configured to address the environment the high-voltage semiconductor switch is to be located in.

In various embodiments, the high-voltage semiconductor switch may be incorporated into an ASIC. In various embodiments, the high-voltage semiconductor switch may be monolithically-integrated into a chip or into a semiconductor material, which may, among other things, save space and/or reduce losses, such as parasitic losses associated with connecting discrete components that are not monolithically integrated. In various embodiments, a high-voltage semiconductor switch may also serve as a building block by which many higher-order in-situ switching functions may be realized. In various embodiments, the high-voltage semiconductor switch may be a primitive operational circuit of a larger electrical circuit or integrated switching network.

In various embodiments, a high-voltage semiconductor switch may comprise a transmission gate switch comprising two back-to-back (i.e., source-to-source) transistors of the same type and same polarity that together operate as a single, compound transistor. In various embodiments, DMOSFETs (double-diffused metal-oxide semiconductor field-effect transistor) may be used for the transmission gate switch. In various embodiments, any suitable class of transistor may be used (e.g., MOSFET, LDMOSFET, BJT, IGBT, MESFET, HEMT, etc.) and/or any suitable channel polarity may be used (e.g., n-type, p-type, or ambipolar).

In various embodiments, the two back-to-back transistors of the transmission gate switch comprise two DMOSFETs to withstand the high bipolar OFF-state voltages required by the embodiment. DMOSFETs have high break down voltages. DMOSFETs have a built-in diode, so in one direction DMOSFETs can withstand 10-35 V but in the other direction there is a diode (0.7 V drop). The two DMOSFETs in series, back-to-back can withstand +/−35V between the ON and OFF terminals when they are off. When they are on, there is almost 0V across them (with about 1 kiloohm of resistance).

In various embodiments, DMOSFETs may be used as DMOSFETs may operate over a greater temperature range than MOSFETs, including operating at lower temperatures without freeze-out.

In various embodiments, the FETs used in the transmission gate switch may be either both p-channel or both n-channel, and the FETs used in the transmission gate switch may be either both enhancement type or both depletion type. As generally understood by one of ordinary skill in the art, p-channel FETs use hole flow as the primary charge carrier, n-channel FETs use electron flow as the primary charge carrier, enhancement type FETs are normally off devices (e.g., current does not flow through the FET when voltage applied to the gate is 0V), and depletion type FETs are normally on devices (e.g., current does flow through the FET when voltage applied to the gate is 0V).

In various embodiments, a high-voltage semiconductor switch may comprise a gate driver subcircuit which limits the voltage that goes to the gate of the transmission gate switch. In various embodiments in which the transmission gate switch comprises N-type transistors, the gate driver block drives the gate of the transmission gate switch relative to the most negative voltage on either the input or the output of the transmission gate switch. In this case, the gate driver may be termed a "mindrive." In various embodiments in which the transmission gate switch comprises P-type transistors, the gate driver block drives the gate of the transmission gate switch relative to the most positive voltage on either the input or the output of the transmission gate switch. In this case, the gate driver may be termed a "maxdrive."

In various embodiments, DMOSFETs (double-diffused metal-oxide semiconductor field-effect transistor) may be used, though other embodiments may use, for example, other types of transistors, such as junction FETs (JFET), Metal-Insulator-Semiconductor FETs (MISFETs), Metal-Semiconductor (MESFETs), High Electron Mobility Transistors (HEMTs), and/or Heterojunction FET (HFET).

In various embodiments, various complementary MOS fabrication techniques performable in a typical semiconductor fabrication facility or foundry with a silicon on insulator (SOI) process may be used to manufacture the FETs in the high-voltage semiconductor switch. In various embodiments, such processes include, but are not limited to, dopant implantations, drive-in anneals, photolithography for source-drain and gate electrode definitions, SiO2 oxidation, other oxide depositions, and poly-Si and silicide depositions.

In various embodiments, the high-voltage semiconductor switch serves as a single-pole single-throw semiconductor-based switch with the enable line serving as the throw control. In alternative embodiments, configurations may include single-pole double-throw (SPDT) switches, double-pole double-throw (DPDT) switches, and/or their derivatives. The DPDT configuration may be used for waveform distribution, and it may be achieved by ganging and/or coupling two SPST switches' enable lines in an inverted configuration such that when one SPST is on the other is off. In other embodiments, similar practice will lead to the additional variations of high-voltage semiconductor switch configurations.

In various embodiments, switch-related noise must also be mitigated. Switch noise in semiconductor-based switches arises due to several factors. Two switch-related noise sources that are important in the application of interest are charge injection from capacitive imbalance between the load and pass transistors and during specific on/off transitions of the switch when one switch is not entirely turned off when another switch turns on. The former has been referred to as "switch glitch" and occurs when excess charge, due to the imbalanced capacitance between load and transistor gate, is deposited on the load during an on/off transition. The result is an incrementally small excess voltage over the intended level present at the load. This excess voltage may be allowed to build through successive switch cycles as the capacitance imbalance continues to allow excess charge to be transferred.

In various embodiments, such a glitch may be largely mitigated by placing glitch cancelation circuitry on the output node of the switch. In various embodiments, the glitch cancelation circuitry produces an opposite voltage jump to produce an opposite glitch that cancels (entirely or partially) the switch glitch. In various embodiments, such a glitch cancelation circuitry may comprise any suitable circuitry that produces the desired opposite voltage jump and opposite glitch.

In various embodiments, such a glitch cancelation circuitry may comprise a balance capacitor on the output node of the switch as a means to match transistor capacitance to the load. In various embodiments, the capacitor(s) may serve to match capacitance and therefore to mitigate or eliminate the excess charge injection to the load in the system. In various embodiments, the value of the balance capacitor is equal to about one-half of the gate capacitance of the equivalent transistor of the transmission gate switch (or equal to about the capacitance of one of the DMOSFETs of the transmission gate switch. In some embodiments, the balance capacitor may not be exactly equal to about one-half of the gate capacitance of the equivalent transistor of the transmission gate switch, but may vary as needed. Such a variance may be determined by using simulation or by experimentation.

In various embodiments, such a glitch cancelation circuitry may comprise a dummy switch that would change its state at the same time as the transmission gate switch but would not cause any other changes in the circuitry (i.e., its output would not be connected to anything).

Such a glitch is not a problem, or less of a problem, when turning on the equivalent transistor (i.e., closing the switch) because either the input or the output will typically have a low impedance resulting in a glitch of microvolts. However, when turning off the equivalent transistor (i.e., opening the switch), there will be a current be in the opposite direction of the same magnitude, and that current will go to both the input and the output. Since the output will more likely have a high impedance, this could result in a glitch of several hundred millivolts. By putting the balance capacitor at the output, when DRV1 is turned off and DRV0 is turned on, they both produce a current glitch but of the exact opposite sign such that they will cancel each other out (or nearly so).

In embodiments related to quantum computers, the ion trap architectures of an example quantum computer may possess electrode quantities in excess of several thousand, which may include gridded regions for various ion transport operations. These ion trap architectures may use an interconnect paradigm requiring a wire bond and a physical feedthrough signal line allocated for every individual electrode. In such embodiments, in order to meet the requirement for this scale of electrodes, an integrated switching network serves to distribute the necessary waveforms for ion transport and to condense the interconnections that are integrated into the trap, and such an integrated switching network may use one or more of the high-voltage semiconductor switches. In various embodiments, the high-voltage semiconductor switch may be positioned inside the cryogenic environment of a quantum computing system in order to minimize signal feedthroughs, interconnects, and parasitic loses while managing an increased electrode count. In such embodiments, the high-voltage semiconductor switch may be a part of an integrated switching network, which may be used in quantum computers based on large-scale ion traps.

In various embodiments, the circuits of a high-voltage semiconductor switch may be compatible for operating in a high-vacuum and cryogenic (e.g., temperature range from over 300K down to below 4K) environment. Cryogenic operation imposes lower limits on doping density of the complementary FETs and diodes. In various embodiments, the cryogenic temperatures ranging from 77K down to below 4K cause the free carriers in Si to experience a reduction in energy due to the (cold) thermal bath. Such reduction in energy should not exceed the characteristic ionization energy of the dopant atom with respect to their nearest energy band (valence or conduction for acceptors and donors, respectively). Otherwise, charges may be retained by their parent dopant atoms and free carrier charge conduction will be quenched, which may be referred to as carrier freeze-out. In such embodiments, this requirement sets a lower limit to dopant density and/or dopant species for Si since the contrast between dopant species and Si energy band structure dictate ionization energy of the dopants.

In various embodiments, the high-voltage semiconductor switch may be used in a quantum computing system, such as the quantum computing system 100 depicted in FIG. 1. FIG. 1 provides a schematic diagram of an example quantum computing system 100 where the quantum processor comprises an atomic object confinement apparatus 120 (e.g., an ion trap and/or the like) having a plurality of atomic objects (e.g., atoms, ions, and/or the like) confined therein, in accordance with an example embodiment. In various embodiments, the quantum computing system 100 comprises a computing entity 10 and a quantum computer 110. In various embodiments, the quantum computer 110 comprises a quantum system controller 30 and a quantum processor 115. In various embodiments, the quantum system controller 30 is configured, programmed, and/or the like to control the quantum processor 115. In an example embodiment, the quantum processor 115 comprises a plurality of qubits (e.g., data qubits that may be organized into logical qubits, ancilla qubits, and/or the like). In various embodiments, the quantum computer 110 includes or communicates with databases (not shown) described herein. For example, the databases may be stored by one or more computing entities 10 that are in communication with the controller 30 via one or more wired and/or wireless networks 80 and/or stored by memory local to the controller 30.

In various embodiments, the quantum processor 115 comprises means for controlling the evolution of quantum states of the qubits. For example, in an example embodiment, the quantum processor 115 comprises a cryostat and/or vacuum chamber 40 enclosing a confinement apparatus 120 (e.g., an ion trap), one or more manipulation sources 60, one or more voltage sources 50, and/or one or more optics collection systems 70. For example, the cryostat and/or vacuum chamber 40 may be a temperature and/or pressure-controlled chamber. In an example embodiment, the manipulation signals generated by the manipulation sources 60 are provided to the interior of the cryostat and/or vacuum chamber 40 (where the atomic object confinement apparatus 120 is located) via corresponding optical paths 66 (e.g., 66A, 66B, 66C). In an example embodiment, the one or more manipulation sources 60 may comprise one or more lasers (e.g., optical lasers, microwave sources, and/or the like). In various embodiments, the one or more manipulation sources 60 are configured to manipulate and/or cause a controlled quantum state evolution of one or more atomic objects within the confinement apparatus. In various embodiments, the atomic objects within the atomic confinement apparatus (e.g., ions trapped within an ion trap) act as the data qubits and/or ancilla qubits of the quantum processor 115 of the quantum computer 110. For example, in an example embodiment, wherein the one or more manipulation sources 60 comprise one or more lasers, the lasers may provide one or more laser beams to atomic objects trapped within the confinement apparatus 120 within the cryostat and/or vacuum chamber 40. For example, the manipulation sources 60 may generate and/or provide laser beams configured to ionize atomic objects, initialize atomic objects within the defined two state qubit space of the quantum processor, perform gates one or more qubits of the quantum processor, read a quantum state of one or more qubits of the quantum processor, and/or the like.

In various embodiments, the quantum computer 110 comprises an optics collection system 70 configured to collect and/or detect photons generated by qubits (e.g., during reading procedures). The optics collection system 70 may comprise one or more optical elements (e.g., lenses, mirrors, waveguides, fiber optics cables, and/or the like) and one or more photodetectors. In various embodiments, the photodetectors may be photodiodes, photomultipliers, charge-coupled device (CCD) sensors, complementary metal oxide semiconductor (CMOS) sensors, Micro-Electro-Mechanical Systems (MEMS) sensors, and/or other photodetectors that are sensitive to light at an expected fluorescence wavelength of the qubits of the quantum computer 110. In various embodiments, the detectors may be in electronic communication with the quantum system controller 30 via one or more A/D converters 225 (see FIG. 2) and/or the like.

In various embodiments, the quantum computer 110 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement apparatus 120, in an example embodiment. Varying the electrical potential(s) may move the ions between locations or states. In various embodiments, how to vary the electrical potential(s) may be defined by waveforms that specify one or more voltages to apply over a period of time. In various embodiments, the one or more voltage source 50 may be coupled to electrodes via circuitry including one or more high-voltage semiconductor switches. The circuitry coupling the voltage sources 50 to the electrodes may also include circuitry providing bias voltages, such as to a gate of one or more FETs in one or more of the high-voltage semiconductor switches. The circuitry coupling the voltage sources 50 the electrodes may also include circuitry connecting one or more voltage sources to the gates and/or drains of the one or more FETs in one or more of the high-voltage semiconductor switches. In various embodiments, the circuitry coupling the voltage sources 50 the electrodes may be located outside the cryostat and/or vacuum chamber 40, inside the cryostat and/or vacuum chamber 40, or both inside and outside the cryostat and/or vacuum chamber 40. In embodiments where the circuitry coupling the voltage sources 50 to the electrodes is located in the cryostat and/or vacuum chamber 40, the high-voltage semiconductor switch may be located in the cryostat and/or vacuum chamber 40. In various embodiments the circuitry coupling the voltage sources 50 to the electrodes, including the one or more high-voltage semiconductor switches, will be comprised of circuit components capable of and/or configured to operate at the temperatures for their location, such as those in the cryostat and/or vacuum chamber, which may have temperatures below 4 Kelvin.

In various embodiments, a computing entity 10 is configured to allow a user to provide input to the quantum computer 110 (e.g., via a user interface of the computing entity 10) and receive, view, and/or the like output from the quantum computer 110. The computing entity 10 may be in communication with the quantum system controller 30 of the quantum computer 110 via one or more wired or wireless networks 80 and/or via direct wired and/or wireless communications. In an example embodiment, the computing entity 10 may translate, configure, format, and/or the like information/data, quantum computing algorithms and/or circuits, and/or the like into a computing language, executable instructions, command sets, and/or the like that the quantum system controller 30 can understand and/or implement. For example, the controller 30 is configured to generate machine code level commands configured to, when executed by the appropriate components of the quantum computer 110, cause the performance of a quantum circuit by the quantum computer 110. In various embodiments, the performance of a quantum circuit may include providing and/or controlling voltages to one or more terminals of a high-voltage semiconductor switch, which may control how the high-voltage semiconductor switch provides voltage to one or more electrodes.

In various embodiments, the quantum system controller 30 is configured to control the voltage sources 50, cryostat system and/or vacuum system controlling the temperature and pressure within the cryostat and/or vacuum chamber 40, manipulation sources 60, and/or other systems controlling various environmental conditions (e.g., temperature, pressure, and/or the like) within the cryostat and/or vacuum chamber 40 and/or configured to manipulate and/or cause a controlled evolution of quantum states of one or more atomic objects within the confinement apparatus. For example, the quantum system controller 30 may cause a controlled evolution of quantum states of one or more atomic objects within the confinement apparatus to execute a quantum circuit and/or algorithm. For example, the quantum system controller 30 may cause a reading procedure comprising coherent shelving to be performed, possibly as part of executing a quantum circuit and/or algorithm. Additionally, the quantum system controller 30 is configured to communicate and/or receive input data from the optics collection system 70 and corresponding to the reading of the quantum state of qubits of the quantum computer 110. In various embodiments, the atomic objects confined within the confinement apparatus are used as qubits of the quantum computer 110.

In various embodiments, a quantum computer 110 comprises a quantum system controller 30 and a quantum processor 115. The quantum system controller 30 is configured to control various components of a quantum processor 115.

In various embodiments, the quantum system controller 30 is in communication with an optics collection system 70 such that the quantum system controller 30 is configured to receive input data captured and/or generated by the optics collection system 70. In various embodiments, the quantum system controller 30 is further configured to control a cryostat system and/or vacuum system controlling the temperature and pressure within the cryostat and/or vacuum chamber 40, cooling system, and/or other systems controlling the environmental conditions (e.g., temperature, humidity, pressure, and/or the like) within the cryostat and/or vacuum chamber 40.

As shown in FIG. 2, in various embodiments, the quantum system controller 30 may comprise various quantum system controller elements including processing element(s) 205, memory 210, driver controller elements 215, a communication interface 220, analog-digital (A/D) converter(s) 225, and/or the like. In various embodiments, the quantum system controller 30 is configured to receive input data generated by the optics collection system via the A/D converter(s) 225. In various embodiments, the processing element(s) 205 are configured to operate as described herein.

In various embodiments, the processing element(s) 205 comprise processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing elements and/or circuitry, and/or the like. The term circuitry may refer to an entirely hardware embodiment or a combination of hardware and computer program products. In an example embodiment, a processing element 205 of the quantum system controller 30 comprises a clock and/or is in communication with a clock.

In various embodiments, the memory 210 comprises non-transitory memory such as volatile and/or non-volatile memory storage such as one or more of hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 210 may store a queue of commands to be executed to cause a quantum algorithm and/or circuit to be executed (e.g., an executable queue), qubit records corresponding the qubits of quantum computer (e.g., in a qubit record data store, qubit record database, qubit record table, and/or the like), a calibration table, computer program code (e.g., in a one or more computer languages, specialized quantum system controller language(s), and/or the like), and/or the like. In an example embodiment, execution of at least a portion of the computer program code stored in the memory 210 (e.g., by a processing element 205) causes the quantum system controller 30 to perform one or more steps, operations, processes, procedures, and/or the like for generating one or more sets of commands configured to cause the quantum processor 115 to perform at least a portion of a quantum circuit; to update one or more qubit registries; and/or the like. In an example embodiment, execution of at least a portion of the computer program code stored in the memory 210 causes the quantum system controller 30 to cause one or more commands to be performed.

In various embodiments, the driver controller elements 215 include one or more drivers and/or quantum system controller elements each configured to control one or more drivers. In various embodiments, the driver controller elements 215 may comprise drivers and/or driver controllers. For example, the driver controllers may be configured to cause one or more corresponding drivers to be operated in accordance with executable instructions, commands, and/or the like generated, scheduled. and executed by the quantum system controller 30. For example, the processing element 205 may generate one or more commands to be performed by a first driver.

In various embodiments, the driver controller elements 215 enable the quantum system controller 30 to operate voltage sources 50, manipulation sources 60, cooling system, vacuum systems, and/or the like. In various embodiments, the drivers may be drivers for controlling the flow of current and/or voltage applied to electrodes (e.g., configured to operate and/or control one or more voltage sources 50) used for maintaining and/or controlling the trapping potential of the confinement apparatus 120 (and/or other drivers for providing driver action sequences to potential generating elements of the confinement apparatus); laser drivers (e.g., configured to operate and/or control one or more manipulation sources 60); vacuum component drivers; cryostat and/or vacuum system component drivers; cooling system drivers, and/or the like.

In various embodiments where the drivers control the flow of current and/or voltage applied to electrodes, the driver controller elements 215 may control the high-voltage semiconductor switch. For example, control of the high-voltage semiconductor switch may be by controlling the voltage applied to one or more of the FETs, including controlling the differences in voltage(s) applied to the gate, source, and/or drain of a FET. In various embodiments, the control of voltage(s) may be through additional circuits connected to the high-voltage semiconductor switch (not depicted in the figures) such as a switching network, an example of which is described in U.S. application Ser. No. 17/305,201, filed Jul. 1, 2021, the contents of which is hereby incorporated by reference in its entirety.

In various embodiments, each of driver controller elements 215 correspond to an endpoint within the system (e.g., a component of a manipulation source 60, a component of a voltage source 50 (radio frequency voltage sources, arbitrary waveform generators (AWG), direct digital synthesizer (DDS), and/or other waveform generator), a component of a cooling and/or vacuum system, a component of the optics collection system 70, and/or the like). Each endpoint within the quantum computer 110 represents an individual hardware control. Each endpoint may have its own set of accepted micro-commands, in various embodiments. Examples include but are not limited to a voltage source 50 such as a direct digital synthesizer (DDS), component of an optics collection system 70 such as a photomultiplier tube (PMT), a component of a manipulation source 60 such as a laser driver and/or optical modulator switch, and/or general-purpose output (GPO). Individual commands for a DDS allow for setting power level, frequency and phase of a controlling signal generated thereby. Commands for a PMT interface include start/stop photon count and reset of count, in various embodiments. Commands for a GPO endpoint include setting and/or clearing one or more output lines. These output lines can be used to control external hardware in a manner synchronized with the execution of a quantum circuit.

In various embodiments, the quantum system controller 30 comprises means for communicating and/or receiving signals from one or more optical receiver components (e.g., of the optics collection system 70). For example, the quantum system controller 30 may comprise one or more analog-digital (A/D) converter(s) 225 configured to receive signals from one or more optical receiver components (e.g., a photodetector of the optics collection system 70), calibration sensors, and/or the like. In various embodiments, the A/D converter(s) 225 are configured to write the input data generated by converting the received signals generated by one or more optical receiver components of the optics collection system 70 to memory 210.

In various embodiments, the quantum system controller 30 may comprise a communication interface 220 for interfacing and/or communicating with, for example, a computing entity 10. For example, the quantum system controller 30 may comprise a communication interface 220 for receiving executable instructions, command sets, and/or the like from the computing entity 10 and providing output received from the quantum computer 110 (e.g., from an optics collection system 70) and/or the result of a processing the output to the computing entity 10. In various embodiments, the computing entity 10 and the quantum system controller 30 may communicate via a direct wired and/or wireless connection and/or via one or more wired and/or wireless networks 80.

FIG. 3 provides an illustrative schematic representative of an example computing entity 10 that can be used in conjunction with embodiments of the present disclosure. In various embodiments, a computing entity 10 is a classical (e.g., semiconductor-based) computer configured to allow a user to provide input to the quantum computer 110 (e.g., via a user interface of the computing entity 10) and receive, display, analyze, and/or the like output from the quantum computer 110. In various embodiments, a user may use computing entity 10 to provide input to the quantum computer 110 that may directly or indirectly control one or more high-voltage semiconductor switches, such as when a user may provide input that results in a quantum circuit being created and/or executed, which may require a high-voltage semiconductor switch to be enabled or disable (e.g., turned ON or OFF). For example, in various embodiments, a high-voltage semiconductor switch controls the application of voltage (e.g., by a voltage source 50) to an electrode of ion trap used as part of a quantum processor 115. As should be understood, various embodiments of high-voltage semiconductor switches may be used in a variety of other applications.

As shown in FIG. 3, a computing entity 10 can include an antenna 315, a transmitter 305 (e.g., radio), a receiver 310 (e.g., radio), and a processing element 320 that provides signals to and receives signals from the transmitter 305 and receiver 310, respectively. The signals provided to and received from the transmitter 305 and the receiver 310, respectively, may include signaling information/data in accordance with an air interface standard of applicable wireless systems to communicate with various entities, such as a quantum system controller 30, other computing entities 10, and/or the like. The computing entity 10 can include a network interface 335, which may provide signals to and receive signals in accordance with an interface standard of applicable network systems to communicate with various entities, such as a quantum system controller 30, other computing entities 10, and/or the like.

In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 325 and/or speaker/speaker driver coupled to a processing element 320 and a touch screen, keyboard, mouse, and/or microphone coupled to a processing element 320). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 330 (hard or soft), a touch display, voice/speech or motion interfaces, scanners, readers, or other input device. In embodiments including a keypad 330, the keypad 330 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 340 and/or non-volatile storage or memory 345, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

FIG. 4A provides a schematic diagram of an example confinement apparatus 400 that comprises a plurality of one-dimensional trapping regions 410 (e.g., 410A, 410B, 410C, 410D). The respective trapping regions 410 are connected to other trapping regions of the confinement apparatus 400 via junctions 420. For example, trapping regions 410A, 410B, 410C, 410D are connected to one another via junction 420. As used herein, the trapping regions 410A, 410B, 410C, and 410D are connected to another via junction 420 in the sense that one or more quantum objects disposed in trapping region 410A may be transported to any of trapping regions 410B, 410C, or 410D via the junction 420. In the illustrated embodiment, the trapping regions are arranged and/or configured to provide a periodic or quasi-periodic array 405 of trapping regions 410.

FIG. 4B provides a schematic diagram of trapping regions 410A and 410B. In various embodiments, the confinement apparatus 400 comprises one or more radio frequency (RF) electrodes, referred to as RF rails 412 (e.g., 412A, 412B) herein. A periodic voltage signal (e.g., having radio frequency periodicity) is applied to the RF rail(s) 412 to generate a confining or trapping pseudopotential that generally defines the one-dimensional trapping regions 410.

The electric potential along the axis 413 of the trapping region 410 is controlled by an electrode sequence 430 (e.g., 430A, 430B). In various embodiments, an electrode sequence 430 comprises a respective plurality of control electrodes 414 (e.g., 414A, 414B, 414C, 414D, 414E).

In various embodiments, each control electrode 414 is in communication with a respective control voltage source (via wires, leads, traces, and/or the like) such that a time varying direction current (DC) control voltage signal generated by the respective control voltage source is applied to the respective control electrode 414. In various embodiments, the control voltage signals provided to each of the plurality of control electrodes of an electrode sequence 430 is configured to define an electric potential well within the respective trapping region 410 corresponding to the electrode sequence 430. As used herein, an electrode sequence 430A corresponds to trapping region 410A when the electrode sequence 430A is configured to control the electric potential in the trapping region 410A. The control voltage signal may be varied over time to cause one or more electric potential wells to move along the one-dimensional trapping region. When two electric potential wells are present, the electric potential wells may be moved in the same or different directions along the one-dimensional trapping region 410 based on the control voltage signals applied to the electrodes 414 of the electrode sequence 430.

As should be understood, FIG. 4B illustrates one example control electrode configuration. Various other embodiments may include more or fewer than five control electrodes 414 in each sequence of control electrodes 430. In various embodiments, an electrode sequence of control electrodes 414 may include control electrodes 414 disposed outside of the RF rails 412 and/or between the RF rails 412. In an example embodiment, an electrode sequence may include one or more control electrodes that are neither switchable control electrodes nor broadcast control electrodes.

It should be understood that FIG. 4A illustrates one example of a periodic or quasi-periodic array of trapping regions. Various other embodiments include a plurality of trapping regions that each have a common structure (e.g., are defined by respective electrode sequences that are substantially the same), having zero or more broadcast electrodes and one or more switchable control electrodes, which may or may not be interconnected by junctions and may or may not have periodic or quasi-periodic array form.

The plurality of control electrodes 414 of an electrode sequence 430 comprises a first switchable control electrode 432 and a second switchable control electrode 434. The first switchable control electrode 432 and the second switchable control electrode 434 are configured to be switchably and/or alternately connected into electrical communication with one of a first switchable control voltage source 5A and a second switchable control voltage source 5B via a control switch 416 (e.g., 416A, 416B). The first switchable control voltage source 5A is configured to generate and provide a first switchable control voltage signal U(t). In various embodiments, the first switchable control voltage signal U(t) is a dynamic analog voltage signal. The second switchable control voltage source 5B is configured to generate and provide a second switchable control voltage source S(t). In various embodiments, the second switchable control voltage signal S(t) is a dynamic analog voltage signal.

As illustrated, control switch 416B is in a first switch position where the first switchable control electrode 432 is in electrical communication with a first switchable control voltage source 5A and the second switchable control electrode 434 is in electrical communication with a second switchable control voltage source 5B. Control switch 416A in a second switch position where the first switchable control electrode 432 is in electrical communication with the second switchable control voltage source 5B and the second switchable control electrode 434 is in electrical communication with the first switchable control voltage source 5A.

In an example embodiment, the control switch 416 is a double-pole double-throw switch. Other forms of switches may be used in various other embodiments, as appropriate for the application.

In various embodiments, the control switch 416 of a respective trapping region 410 is independently operable and/or controllable. As used herein, independently controllable means that the state or output of an element is independent of the state or output of each of the other like elements of the confinement apparatus. For example, the switch position of a first control switch 416A is configured to be independent of the switch position of all the other switches 416 of the confinement apparatus 400.

In various embodiments, the control switch 416 is controlled by a switch signal. For example, the switch is in electrical communication with a switch signal generator 20 (e.g., 20A, 20B). In an example embodiment, the switch signal generator is a digital signal generator. For example, in the illustrated embodiment, the switch signal is a single bit digital signal (e.g., either a first voltage representing "0" or a second voltage representing "1"). For example, when the switch signal is a first voltage, the switch is switched to and/or maintained in a first switch position and when the switch signal is a second voltage, the switch is switched to and/or maintained in a second switch position. Switching or changing the switch position changes with which of the first and second switchable control voltage sources 5A, 5B the first and second switchable control electrodes 432, 434 are in electrical communication.

In an example embodiment, the first switchable control electrode 432 is always in electrical communication with an opposite one of the first switchable control voltage source 5A and the second switchable control voltage source 5B with respect to the second switchable control electrode 434. In an example embodiment, the first switchable control electrode 432 is always in electrical communication with a same one of the first switchable control voltage source 5A and the second switchable control voltage source 5B with respect to the second switchable control electrode 434 For example, the switchable electrical communication between the first switchable control electrode 432 and the first and second switchable control voltage sources 5A, 5B and the switchable electrical communication between the second switchable control electrode 434 and the first and second switchable control voltage sources 5A, 5B is controlled by a single control switch 416. For example, switching which of the first and second switchable control voltage sources 5A, 5B that the first switchable control electrode 432 is in electrical communication with also changes which of the first and second switchable control voltage sources 5A, 5B that the second switchable control electrode 434 is in electrical communication with.

In various embodiments, the control switch 416 may define more than two switch positions. For example, in an example embodiment, a control switch 416 is switchable among two or more switch positions and each respective switch position of the two or more switch positions is configured to cause the first switchable control electrode to be in electrical communication with a selected one of two or more selectable control voltage. In various embodiments, more than two control electrodes 414 are in communication with a control switch 416. In various embodiments, a trapping region 410 may be associated with more than one control switch 416. For example, a control switch 416 may be configured to enable switchable control of placing the first switchable control electrode 432 and the second switchable control electrode 434 into electrical communication with more than two switchable control voltage sources. In another example, a second switch of a trapping region 410 may be configured to enable switchable control of placing a third switchable control electrode and a fourth switchable control electrode each into electrical communication with a respective selected one of a third switchable control voltage source and a fourth switchable control voltage source. For example, in various embodiments, N switchable control voltage sources are switchably and/or alternately in electrical communication with M control electrodes 414 of each trapping region 410 of the periodic or quasi-periodic array 405 and/or plurality of trapping regions 410 of the confinement apparatus 400, where N and M are integers greater than zero.

As illustrated in FIG. 4B, the first switchable control voltage source 5A and the second switchable control voltage source 5B are in electrical communication with respective electrodes 414 of both the trapping region 410A and the trapping region 410B. In various embodiments, the first switchable control voltage source 5A and the second switchable control voltage source 5B are in electrical communication with respective control electrodes 414 of each trapping region 410 of the periodic or quasi-periodic array 405 and/or plurality of trapping regions 410 of the confinement apparatus 400. In other words, in various embodiments, the number of switchable control voltage sources 5A, 5B does not scale with the number of trapping regions 410 of the confinement apparatus 400. For example, a quantum computing system comprising a confinement apparatus comprising 400 trapping regions may include the same number of switchable control voltage sources as a quantum computing system comprising a confinement apparatus comprising 10,000 trapping regions. However, the switchable electrical connection between the respective switchable control electrodes and the respective switchable control voltage sources 5A, 5B enable conditional performance of operations in each of the trapping regions 410.

In various embodiments, the plurality of control electrodes 414 of an electrode sequence 430 comprises one or more broadcast control electrodes 436. In various embodiments, each broadcast control electrode 436 is configured to be in electrical communication with a respective one of one or more broadcast control voltage sources 440 (e.g., 440A, 440B, 440C). In various embodiment, each broadcast control voltage source 440 is configured to generate and provide a respective broadcast control voltage signal V(t) (e.g., $V_1(t)$, $V_2(t)$, $V_3(t)$). In various embodiments, the broadcast control voltage signals are analog voltage signals.

In various embodiments, the electrical communication between a broadcast control electrode 436 and the respective broadcast control voltage source 440 is stable, consistent, and/or not changing throughout the operation of a quantum computing system comprising the confinement apparatus 400 comprising the broadcast control electrode 436. For example, the control electrode 414B of trapping region 410A and the control electrode 414B of trapping region 410B are always in electrical communication with a first broadcast control voltage source 440A throughout operation of a quantum computing system comprising the confinement apparatus 120 and the first broadcast control voltage source 440A.

As illustrated in FIG. 4B, the broadcast control voltage sources 440 are in electrical communication with respective broadcast control electrodes 436 of both the trapping region 410A and the trapping region 410B. The broadcast control voltage sources 440 are referred to as "broadcast" herein due to the voltage signals generated by the broadcast control voltage signals being provided to a plurality of respective broadcast control electrodes 436 of respective trapping regions. In various embodiments, the broadcast control voltage sources 440 are in electrical communication with respective broadcast control electrodes 436 of each trapping region 410 of the periodic or quasi-periodic array 405 and/or plurality of trapping regions 410 of the confinement apparatus 400. In other words, in various embodiments, the number of broadcast control voltage sources 5 does not scale with the number of trapping regions 410 of the confinement apparatus 400. For example, a quantum system comprising a confinement apparatus comprising 400 trapping regions may include the same number of broadcast control voltage sources as a quantum computing system comprising a confinement apparatus comprising 10,000 trapping regions (given that both confinement apparatuses have the same number of control electrodes and/or broadcast control electrodes per electrode sequence).

In various embodiments, the broadcast control voltage sources 440 are in electrical communication with respective broadcast control electrodes 436 of each trapping region 410 of the periodic or quasi-periodic array 405 and/or plurality of trapping regions 410 of the confinement apparatus 400. Thus, the electric potential generated by a first electrode sequence 430A is the same as the electric potential generated by a second electrode sequence 430B when the first control switch 416A coupled to the first electrode sequence 430A and the second control switch 416B coupled to the second electrode sequence 430B are in the same switch position.

However, the electric potential generated by a first electrode sequence 430A is different from the electric potential generated by a second electrode sequence 430B when the first control switch 416A coupled to the first electrode sequence 430A and the second control switch 416B coupled to the second electrode sequence 430B are in different switch positions. Thus, in an example embodiment, a conditional operation may be performed in each trapping region 410 having the corresponding control switch 416 in a first switch position and the performance of the conditional operation is prevented in each trapping region 410 having the corresponding control switch 416 in a second switch position.

In various embodiments, the plurality of trapping regions 410 are divided into groups. For example, for the periodic or quasi-periodic array 405, the trapping regions 410 may be divided into a group of horizontal trapping regions, including trapping regions 410A and 410B, and a group of vertical trapping regions, including trapping regions 410C and 410D. In an example embodiment, a set of broadcast control voltage sources 440 is provided for each group of trapping regions. For example, trapping regions 410A and 410B comprise broadcast control electrodes 436 that are each in electrical communication with a respective broadcast control voltage source of a first set of broadcast control voltage sources and trapping regions 410C and 410D comprise broadcast control electrodes 436 that are each in electrical communication with a respective broadcast control voltage source of a second set of broadcast control voltage sources. For example, this enables independent control of operations performed in "vertical" trapping regions and operations performed in "horizontal" trapping regions while the number of voltage sources required does not scale with the number of trapping regions in the plurality of trapping regions.

In various embodiments, the trapping regions 410 are divided into groups based on sub-arrays of the confinement apparatus 400. In various embodiments, the plurality of trapping regions 410 are divided into groups based on dimensions and/or directions of the period or quasi-periodic array 405. For example, if the periodic or quasi-periodic array 405 of trapping regions 410 is a two-dimensional array, the trapping regions 410 may be divided into two groups where each group represents one of the dimensions of the array (e.g., horizontal and vertical in the example provided above). If the periodic or quasi-periodic array 405 is a three-dimensional array, the trapping regions 410 may be divided into three groups where each group represents one of the dimensions of the array, for example. In various embodiments, the trapping regions 410 may be divided into a number of groups based on factors other than the dimension of the trapping apparatus. For example, groups may be designated for certain operational purposes such as gating, initialization, measurement, loading, storage, cooling, or other functions necessary for the operation of the quantum computing system.

In an example embodiment, the plurality of broadcast control voltage sources 440 comprise a first set of broadcast control voltage sources and a second set of broadcast control voltage sources. The plurality of broadcast control electrodes of a given electrode sequence are selectively in electrical communication with respective broadcast control voltage sources of the first set of broadcast sources or the second set of broadcast sources so as to reduce cross-talk between sequences of electrodes of the plurality of sequences of electrodes. For example, in an example embodiment, the determination of whether the broadcast control electrodes of a given electrode sequence are in electrical communication with respective broadcast control voltage sources of the first of broadcast control voltage sources or the second set of broadcast control voltage sources is determined based on the whether the switch position of one or more adjacent electrode sequences is the same or a different switch position as the given electrode sequence.

In another example embodiment, the switchable control voltage sources comprise more than two switchable control voltage sources that are each configured to generate and provide a respective switchable control voltage signal. The control switches 416 are configured to enable switching electrical communication of the first and second switchable control electrodes 432, 434 among the more than two switchable control voltage sources. For example, the controller 30 may determine whether to place the first and second switchable control electrodes 432, 434 of a respective electrode sequence in electrical communication with respective ones of a first switchable control voltage source and a second switchable control voltage source or with respective ones of a third switchable control voltage source and a fourth switchable control voltage source based at least in part on the assigned switch positions of adjacent trapping regions so as to reduce any possible cross-talk between trapping regions.

The respective switchable electrical communication between the first switchable control electrode 432 and the second switchable control electrode 434 with the first switchable control voltage source 5A and the second switchable control voltage source 5B enables a conditional motion primitive that can be individually controlled in each of the trapping regions 410 via respective switches 416 even though respective broadcast control electrodes 436 of a plurality of trapping regions are each in electrical communication with the same respective broadcast control voltage sources 440.

In some embodiments, an electrode sequence 430 comprises one or more shim electrodes 418. The shim electrodes 418 are in electrical communication with a set of shim voltage sources 15. In various embodiments, stray fields in the confinement apparatus 400 may cause some motion operations in some trapping regions to be unreliable. To compensate for the stray fields, one or more quasi-static analog voltage signals are applied to one or more shim electrodes 418, in an example embodiment.

Trapping region 410B as illustrated in FIG. 4B illustrates a shim electrode 418 that is in electrical communication with a capacitor 419 that is selectively in electrical communication with a shim voltage source 15 via a shim switch 415. For example, in an example embodiment, the shim electrode voltages may be written by a shim voltage source 15 through a shim switch 415 and stored on a capacitor 419 in electrical communication with the shim electrode 418 upon which the shim voltage source is disconnected from the shim electrode (e.g., the switch is opened), leaving the capacitor 419, which is in constant electrical communication with the shim electrode, to hold the voltage value. Periodically, the shim electrode voltage is refreshed by writing it again by closing the switch to electrically connect the shim voltage source to the shim electrode and associated capacitor storage. In an example embodiment, the shim voltage periodically applied to the shim electrode may be substantially the same or substantially different than the previous value. In this way, the shim voltage value may maintain the necessary value to compensate for stray field drift and overcome slow voltage drift of the capacitor storage due to leakage currents. In another example embodiment, the shim voltage may change to effectuate different operational results. For example, the shim value may be written for gating purposes to a different value than the value used for measurement purposes.

In another example embodiment, a voltage adder is used to insert a quasi-static voltage signal onto one or more of the control electrodes 414. In an example embodiment, a shim electrode 418 is one of the control electrodes 414. As used herein, the term quasi-static refers to an analog signal that changes more slowly in time than the control voltage signals (e.g., U(t), S(t), $V_1$(t), $V_2$(t), $V_3$(t)). For example, the quasi-static voltage signals may have a slower update and/or a lower frequency filter cut-off than the control voltage signals.

In various embodiments, the shim electrode 418 is in switchable electrical communication with one of a first shim voltage source 15A and a second shim voltage source 15B. In various embodiments, the first shim voltage source 15A is configured to generate and provide a first shim voltage signal and the second shim voltage source 15 B is configured to generate and provide a second shim voltage signal. In an example embodiment, the first shim voltage signal and the second shim voltage signal are different voltage signals having different amplitudes and/or signs. In various embodiments, the first shim voltage signal is the same amplitude and the opposite sign of the second shim voltage signal. For example, in an example embodiment, the first shim voltage signal is equal to the second shim voltage signal multiplied by negative one.

In various embodiments, the shim electrode 418 is in switchable electrical communication one of a first shim voltage source 15A and a second shim voltage source 15B via a shim switch 415. In various embodiments, the shim switch 415 is controlled via application of switch signal thereto. In an example embodiment, the switch signal applied to the shim switch 415 is the same as that applied to the control switch 416. For example, the shim switch 415 is in electrical communication with the switch signal generator 20, in an example embodiment.

In various embodiments, the same control signals are provided to the respective control electrodes 414 of a plurality of electrode sequences 430 which each corresponding to a respective trapping region 410 of a plurality of trapping regions (e.g., of a periodic or quasi-periodic array of trapping regions). The use of shim switch 415 and/or control switch 416 enables individual control of the respective trapping regions 410. For example, the switch position of the shim switch 415 and/or control switch 416 of a respective trapping region determines whether an operation is performed in the respective trapping region or prevented from being performed in the respective trapping region. In other words, the confinement apparatus 400 is configured for conditional performance of parallel operations.

In an example embodiment, different respective positions along respective trapping regions are configured for the performance of various operations thereat. For example, a first position of each respective trapping region of a plurality of trapping regions may be configured for performing a reading operation. For example, a reading manipulation signal path may be aligned with the first position of each respective trapping region of a plurality of trapping regions. Therefore, when a quantum object is located at the first position of a trapping region and a reading operation is performed (e.g., a reading manipulation signal is propagated along the reading manipulation signal path in order to determine the quantum state of the quantum object) the reading operation is performed on the quantum object. When the quantum object is not located at the first position of the trapping region when the reading manipulation signal is propagated along the reading manipulation signal path, performance of the reading operation on the quantum object is prevented.

A second position of each respective trapping region of the plurality of trapping regions may be associated with a conditional operation such as a single qubit gate, a two qubit gate, a qubit initialization operation (e.g., preparing quantum objects into a known state of a defined qubit space), position swapping of quantum objects located within the same trapping region, or another transport or non-transport operation. Using the shim switch 415 or control switch 416 of each respective trapping region of the plurality of trapping regions, whether one or more quantum objects are present at the second position or not can be controlled independently for each respective trapping region. Thus, the conditional operation is performed in a first subset of the plurality of trapping regions and is prevented from being performed (e.g., by an absence of one or more quantum objects at the second position) in a second subset of the plurality of trapping regions. For example, for an example scenario, each of the trapping regions of the plurality of trapping regions where the corresponding shim switch 415 or control switch 416 is in the first switch position is in the first subset of trapping regions and each of the trapping regions of the plurality of trapping regions where ethe corresponding shim switch 415 or control switch 416 is in the second switch position is the second subset of trapping regions.

In this manner, conditional operations may be performed by the confinement apparatus 400 and/or a quantum computing system comprising the confinement apparatus 400. In various embodiments, the conditional operations include one or more of a junction swap operation, a linear swap operation, a partial row or column shift, arbitrary quantum object sorting, gating of one or more quantum objects, cooling of quantum objects, measurement of quantum objects, initialization of quantum objects, position swapping of quantum objects located within a same trapping region, or another transport or non-transport operation. For example, the controller 30 may determine to perform an operation on first set of quantum objects that are arbitrarily positioned within the plurality of trapping regions and/or periodic or quasi-periodic array 405 of trapping regions and to prevent performance of the operation on a second set of quantum objects that are arbitrarily positioned within the plurality of trapping regions and/or periodic or quasi-periodic array 405 of trapping regions, even when the quantum computing system 100 is particularly configured for the parallel performance of operations.

In various embodiments, the trapping regions 410 are used for performing a conditional motion primitive. Such embodiments are described in pending US Provisional Patent Application Ser. No. 63/379,040, filed Oct. 11, 2022, the contents of which is hereby incorporated by reference in its entirety.

Referring now to FIG. 5, a schematic diagram of a high-voltage semiconductor switch circuit that may be used in accordance with an example embodiment. In various embodiments, a high-voltage semiconductor switch may be comprised of one or more switch subcircuits and/or components. For example, the high-voltage semiconductor switch 500 of FIG. 5 comprises a logic enable portion 505, current distribution portions 510A-D, a gate driver portion 515, a transmission gate portion 520, and a balance capacitor 560. As described in more detail below, the example high-voltage semiconductor switch 500 comprises a plurality of resistors 540A, B, a plurality of NDMOSFETs 545A-M, a plurality of PDMOSFETs 550A-L, and a plurality of PDMOSFETs 555A-C. The example high-voltage semiconductor switch 500 is a +/−5 volt (V) switch. Other example embodiments of the present disclosure will have different ratings, such as but not limited to +/−10V or +/−17V. Such alternative embodiments will have the same general structure and subcircuits, but with somewhat different current distribution portions to provide the higher voltage capability.

In various embodiments, the high-voltage semiconductor switch 500 will contain additional electrical components and/or circuits (not depicted), including input and output terminals that will connect high-voltage semiconductor switch 500 to voltage sources 50 as well all the electrodes of the ion trap. In various embodiments, one high-voltage semiconductor switch 500 may connect to (e.g., be in electrical communication with) all of the electrodes. Alternatively, in other various embodiments, one high-voltage semiconductor switch 500 may connect to a single electrode or may connect to (e.g., be in electrical communication with) some, but not all, of the electrodes.

In some embodiments, the logic enable portion 505 controls the selectable current to each of the first and second drive lines (DRV1, DRV0) in response to first and second control signals received by the logic enable portion on pins S1, S2. In some embodiments, in response to a first control signal received by the logic enable portion 505, a positive voltage is applied to the gates of the two transistors 545L, 545M of the transmission gate portion 520 to turn the respective switch on such that a current flows through the two transistors 545L, 545M from the switch input terminal IN to the switch output terminal OUT. In some embodiments, in response to a second control signal received by the logic enable portion 505, a negative voltage is applied to the gates of the two transistors 545L, 545M of the transmission gate portion 520 to turn the respective switch off such that substantially no current flows through the two transistors 545L, 545M from the switch input terminal IN to the switch output terminal OUT.

As described above, the two transistors 545L, 545M of the of the transmission gate portion 520 act together as an equivalent, ideal transistor. As such, either the input terminal side or the output side can be considered the source or the drain. In operation, whichever side has a lower voltage is considered the source and whichever side has a higher voltage is considered the drain. To turn the equivalent transistor off, requires zero volts between the gate and the source, and to turn it on requires 5 volts above the source. The gate driver portion 515 limits the drive to five volts above the lower of the voltage on the input terminal or the voltage on the output terminal because that is all the gate oxide can take. Putting, for example, 17 volts across the gate would damage the transistors. Having the gate driver portion limit the drive voltage enables the switch of embodiments of the invention to safely handle voltages higher than five volts.

In the illustrated embodiment, the logic enable portion 505 comprises a NAND gate 530 receiving the first and second control signals on pins S1, S2 and an inverter 535 connected to the output of the NAND gate 530 via node ENN. The logic enable portion 505 further comprises a transistor 545A, a resistor 540A, and a transistor 555A connected in series between a current distribution portion 510A and ground VSS. The VDD+5V supply input to the logic enable portion 505 is connected to the gate of the transistor 545A, while the ground VSS input to the logic enable portion 505 is connected to the gate of the transistor 555A. The logic enable portion 505 further comprises a transistor 545B, a resistor 540B, and a transistor 555B connected in series between a current distribution portion 510BA and a current distribution portion 510D. The output of the inverter 535 is connected to the gates of transistor 545B and transistor 555B via node ENP.

The current distribution portion 510A, B, D provides a selectable current to each of a first drive line DRV1 connected to the gates of the two transistors 545L, 545M of the transmission gate portion and a second drive line DRV0 connected to the output terminal OUT to control a relative voltage of the gates of the two transistors of the transmission gate portion and the output terminal. The current distribution portion 510C provides a constant current to the gate driver portion 515. The current distribution portions are also termed current mirrors. The current distribution portions are stacked because of the high voltage requirement of the switch.

As illustrated in FIG. 5, a first current distribution portion 510A comprises two transistors 550A, 550B connected in series between the drive voltage VDD10+10V and the logic enable portion 505.

A second current distribution portion 510B comprises two transistors 550C, 550D connected in series between the drive voltage VDD10 and the logic enable portion 505 and two transistors 550E, 55° F. connected in series between the drive voltage VDD10 and a fourth current distribution portion 510D. The gates of transistor 550C and 550E are connected, and the gates of transistors 550D and 550F are connected. The second current distribution portion 510B further comprises two transistors 550G, 550H connected in series between the drive voltage VDD10 and transistor 545C whose gate is connected to the ENN node and to the gate of transistor 555C and which in turn is connected to the fourth current distribution portion 510D. The second current distribution portion 510B further comprises two transistors 550I, 550J connected in series between the drive voltage VDD10 and the fourth current distribution portion 510D. The gates of transistor 550G and 550I are connected, and the gates of transistors 550H and 550J are connected.

A third current distribution portion 510C comprises two transistors 550K, 550L connected in series between the drive voltage VDD10 and the gate driver portion 515. The gates of transistor 550A and transistor 550K are connected via node VP22A, and the gates of transistor 550B and transistor 550L are connected via node VP22B.

The fourth current distribution portion 510D comprises two transistors 545D, 545E connected in series between the logic enable portion 505 and VSS05 −5V supply, two transistors 545F, 545G connected in series between the second current distribution portion 510B and VSS05, two transistors 545H, 545I connected in series between transistor 555C and VSS05, and two transistors 554J, 545K connected in series between the second current distribution portion 510B and VSS05. The gates of transistors 545D and 545F are connected, the gates of transistors 545E and 545G are connected, gates of transistors 545H and 545J are connected, and gates of transistors 545I and 545K are connected.

The gate driver portion 515 detects a voltage at each of the switch input terminal IN and the switch output terminal OUT and applies a bias voltage to the gates of the two transistors 545L, 545M of the transmission gate portion 520. In various embodiments, the gate driver portion 515 limits the voltage that goes to the gate of the transmission gate switch. If the switch is closed, the voltages on the input terminal and the output terminal will be the same. If the switch is open, the voltages will be different and the gate driver portion 515 determines which voltage is lower and limits the voltage on the gate of the equivalent transistor to, in some embodiments, approximately 5 volts below the lower voltage.

In the illustrated embodiment, the gate driver portion 515 has five inputs and two outputs. Input IB of the gate driver portion 515 is connected to the third current distribution portion 510C. Input VP of the gate driver portion 515 is connected to the drive voltage VDD10. Input VN of the gate driver portion 515 is connected to VSS05. Input A of the gate driver portion 515 is connected to the switch output terminal OUT. Input B of the gate driver portion 515 is connected to the switch input terminal IN. Output VGA of the gate driver portion 515 is connected to DRV0. Output VGB of the gate driver portion 515 is connected to DRV1 which drives the gates of the two transistors 545L, 545M of the transmission gate portion 520.

In various embodiments, the transmission gate portion 520 provides the switching that either prevents current from flowing from the switch input terminal IN to the switch output terminal OUT when closed or allows current to flow from the switch input terminal IN to the switch output terminal OUT when open. In the illustrated embodiment, the transmission gate portion 520 comprises two transistors 545L, 545M connected in series source-to-source (or, alternatively, drain-to-drain) between the switch input terminal IN and the switch output terminal OUT. As described above, in some embodiments the two transistors of the transmission gate portion are the same. In some embodiments, the two transistors of the transmission gate portion are both p-type or both n-type DMOSFETs.

In the illustrated embodiment, the balance capacitor 560 is connected between the VGA output of the gate driver portion 515 and the switch output terminal OUT. As described above, in some embodiments the balance capacitor has a capacitance value of about one-half of the gate capacitance of the equivalent transistor of the transmission gate switch (or equal to about the capacitance of one of the two transistors 545L, 545M of the transmission gate switch.

In various embodiments, the high-voltage semiconductor switch 500 will contain additional electrical components and/or circuits (not depicted), including input and output terminals that will connect high-voltage semiconductor switch 500 to voltage sources 50 as well all the electrodes of the ion trap. In various embodiments, one high-voltage semiconductor switch 500 may connect to (e.g., be in electrical communication with) all of the electrodes. Alternatively, in other various embodiments, one high-voltage semiconductor switch 500 may connect to a single electrode or may connect to (e.g., be in electrical communication with) some, but not all, of the electrodes.

As described above, the gate driver portion detects a voltage at each of the switch input terminal and the switch output terminal and applies a bias voltage to the gates of the two transistors of the transmission gate portion. In the illustrated embodiment, the gate driver portion 515 is a dual gate driver in that the gate driver portion 515 applies a bias voltage to the gates of both transistors of the transmission gate portion. In some alternative embodiments, two separate gate drivers each apply a bias voltage to the gate of a separate one of the two transistors of the transmission gate portion. In some embodiments, a dual gate drive has fewer components that two separate gate drivers, thereby saving space on the circuit chip (e.g., ASIC). Additionally, in some embodiments a dual gate driver needs only one current distribution portion, whereas having two separate gate drivers would require an additional current distribution portion.

Referring now to FIG. 6, the internal components of an example dual gate driver portion 600 is illustrated in accordance with various embodiments of the present disclosure. As seen in FIG. 6, the gate driver portion 600 has the same five inputs (IB, VP, VN, A, B) and the same two outputs (VGA, VGB) as the gate driver portion 515 of FIG. 5. The gate driver portion 600 comprises four transistors 605A-D and a diode 615A connected in series between input VP and output VGA, four transistors 605F-I and a diode 615C connected in series between input VP and output VGB, two transistors 605E, 610A connected in series between output VGA and input VN, and two transistors 605J, 610C connected in series between output VGB and input VN. Input IB is connected to the gates of transistors 605A, 610A, 605F, and 610C. A diode 615B and a transistor 610B are connected in series between input VN and the node connecting input IB and the gates of transistors 605A, 610A, 605F, and 610C. A diode 615D and a transistor 610D are connected in series between input VN and the node connecting input IB and the gates of transistors 605A, 610A, 605F, and 610C. Input A is connected to the gate of transistor 610B, and input B is connected to the gate of transistor 610D. In operation, the components 610B, 610D, 615B, and 615D act to produce a voltage at the IB node equal to approximately 1.6V above the minimum of the voltages at the A and B inputs. Then, when a current is sourced into the VGA terminal, it is limited by 610A and 605E to approximately 3V above the IB voltage or 4.6V above the minimum of VA or VB. But, when a current is sunk out of the VGA terminal, it is limited by the components between IB and VGA to about 5.6V below the IB voltage or 4.0V below the minimum of VA or VB. The VGB terminal works the same way.

Returning to FIG. 5, transistors 550A, 550B, 545A, and 555A together apply four volts above resistor 540A and one volt below resistor 540A, such that there is three volts across resistor 540A. In some embodiments, the resistor 540A is a three megaohm resistor, so a one microamp constant current flows through resistor 540A. The connection between the first current distribution portion 510A and the third current distribution portion 510C enables the one microamp current to flow to input IB of the gate driver portion 515, thereby powering the gate driver portion 515.

In some embodiments, the resistor 540B is also a three megaohm resistor, so a one microamp constant current also flows through resistor 540B. However, this current flowing through resistor 540B is switched based on the input to the logic enable portion 505.

In operation, to turn off the high-voltage semiconductor switch 500 of embodiments of the invention, inputs S1 and S2 to the NAND gate 530 are low. When inputs S1 and S2 are low, node ENN is high and, due to the inverter 535, node ENP is low. Since node ENN is high, transistor 545C turns on and since ENP is low, transistor 555B turns on, causing a current through resistor 540B that pulls the DRV1 low with a drive current determined by resistor 540B. With the DRV1 line pulled low, the transistors 545L, 545M of the transmission gate portion 520 are off and the switch is open.

To turn on the high-voltage semiconductor switch 500 of embodiments of the invention, inputs S1 and S2 to the NAND gate 530 are high. When inputs S1 and S2 are high, node ENN is low and, due to the inverter 535, node ENP is high. Since node ENN is low, transistor 555C turns on and since ENP is high, transistor 545B turns on, causing a current through resistor 540B that pulls the DRV1 high with a drive current determined by resistor 540B. With the DRV1 line pulled high, the transistors 545L, 545M of the transmission gate portion 520 are on and the switch is closed. As described above, in some embodiments, the gate driver portion 515 limits the voltage on the gates of the transistors 545L, 545M of the transmission gate portion 520 to five volts above or below the lower of the voltage on the input terminal or the voltage on the output terminal.

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A quantum object confinement apparatus comprising:
one or more electrode sequences, each electrode sequence comprising a respective plurality of control electrodes configured to control an electric potential in a respective trapping region of one or more trapping regions of the quantum object confinement apparatus, wherein a first switchable control electrode of one or more switchable control electrodes of the respective plurality of control electrodes is configured to be switchably in electrical communication with a respective selected switchable control voltage source of two or more switchable control voltage sources; and
one or more switches, wherein each electrode sequence of the one or more electrode sequences is associated with a respective switch of the one or more switches and the respective switch is configured to control switching of the electrical communication of the one or more switchable control electrodes with the respective selected switchable control voltage sources of the two or more switchable voltage sources, where each of the one or more switches comprises:
a transmission gate portion comprising two transistors connected in series source-to-source or drain-to-drain, the transmission gate portion having a switch input terminal at one end and a switch output terminal at an opposite end, each of the two transistors having a gate, a source, and a drain;
a gate driver portion that detects a voltage at each of the switch input terminal and the switch output terminal and applies a bias voltage to the gates of the two transistors of the transmission gate portion, the applied bias voltage being a predetermined amount above a lesser or a greater of the voltage at the switch input terminal or the voltage at the switch output terminal;
a current distribution portion for providing a selectable current to each of a first drive line connected to the gates of the two transistors of the transmission gate portion and a second drive line; and
a logic enable portion for controlling the selectable current to each of the first and second drive lines in response to first and second control signals received by the logic enable portion;
wherein the logic enable portion controls the selectable current to each of the first and second drive lines in response to the first control signal received by the logic enable portion such that a first voltage is applied to the gates of the two transistors of the transmission gate portion to turn the respective switch on such that a current flows through the two transistors of the transmission gate portion from the switch input terminal to the switch output terminal; and
wherein the logic enable portion controls the selectable current to each of the first and second drive lines in response to the second control signal received by the logic enable portion such that a second voltage is applied to the gates of the two transistors of the transmission gate portion to turn the respective switch off such that substantially no current flows through the two transistors of the transmission gate portion from the switch input terminal to the switch output terminal.

2. The quantum object confinement apparatus of claim 1, wherein the two transistors of the transmission gate portion of each of the one or more switches are both a same type and size of transistor.

3. The quantum object confinement apparatus of claim 1, wherein the two transistors of the transmission gate portion of each of the one or more switches are both a p-type double-diffused metal-oxide-semiconductor (DMOS) transistor or both an n-type DMOS transistor.

4. The quantum object confinement apparatus of claim 1, wherein each of the one or more switches further comprises a glitch cancelation circuitry connected between the switch output terminal and the second drive line.

5. The quantum object confinement apparatus of claim 4, wherein the glitch cancelation circuitry comprises a balance capacitor to balance a gate capacitance of the transmission gate portion.

6. The quantum object confinement apparatus of claim 5, wherein the balance capacitor has a capacitance value of about one-half the gate capacitance of the transmission gate portion.

7. The quantum object confinement apparatus of claim 1, wherein the logic enable portion controls the selectable current to each of the first and second drive lines based on one or more five volt input signals.

8. The quantum object confinement apparatus of claim 1, wherein the current distribution portion provides a constant current to the gate driver portion.

9. A system comprising:
two or more switchable control voltage sources each configured to generate a respective switchable control voltage signal;
a controller configured to control operation of each of the two or more switchable control voltage sources, and with which of the two or more switchable control voltage sources one or more switchable control electrodes are respectively in electrical communication; and
a quantum object confinement apparatus comprising:
one or more electrode sequences, each electrode sequence comprising a respective plurality of control electrodes configured to control an electric potential in a respective trapping region of one or more trapping regions of the quantum object confinement apparatus, wherein a first switchable control electrode of the one or more switchable control electrodes of the respective plurality of control electrodes is configured to be switchably in electrical communication with a respective selected switchable control voltage source of the two or more switchable control voltage sources; and
one or more switches, wherein each electrode sequence of the one or more electrode sequences is associated with a respective switch of the one or more switches and the respective switch is configured to control switching of the electrical communication of the one or more switchable control electrodes with the respective selected switchable control voltage sources of the two or more switchable voltage sources, where each of the one or more switches comprises:

a transmission gate portion comprising two transistors connected in series source-to-source or drain-to-drain, the transmission gate portion having a switch input terminal at one end and a switch output terminal at an opposite end, each of the two transistors having a gate, a source, and a drain;

a gate driver portion that detects a voltage at each of the switch input terminal and the switch output terminal and applies a bias voltage to the gates of the two transistors of the transmission gate portion, the applied bias voltage being a predetermined amount above a lesser or a greater of the voltage at the switch input terminal or the voltage at the switch output terminal;

a current distribution portion for providing a selectable current to each of a first drive line connected to the gates of the two transistors of the transmission gate portion and a second drive line; and a logic enable portion for controlling the selectable current to each of the first and second drive lines in response to first and second control signals received by the logic enable portion;

wherein the logic enable portion controls the selectable current to each of the first and second drive lines in response to the first control signal received by the logic enable portion such that a first voltage is applied to the gates of the two transistors of the transmission gate portion to turn the respective switch on such that a current flows through the two transistors of the transmission gate portion from the switch input terminal to the switch output terminal; and wherein the logic enable portion controls the selectable current to each of the first and second drive lines in response to the second control signal received by the logic enable portion such that a second voltage is applied to the gates of the two transistors of the transmission gate portion to turn the respective switch off such that substantially no current flows through the two transistors of the transmission gate portion from the switch input terminal to the switch output terminal.

10. The system of claim 9, wherein the two transistors of the transmission gate portion of each of the one or more switches are both a same type and size of transistor.

11. The system of claim 9, wherein the two transistors of the transmission gate portion of each of the one or more switches are both a p-type double-diffused metal-oxide-semiconductor (DMOS) transistor or both an n-type DMOS transistor.

12. The system of claim 9, wherein each of the one or more switches further comprises glitch cancelation circuitry connected between the switch output terminal and the second drive line.

13. The system of claim 12, wherein the glitch cancelation circuitry comprises a balance capacitor to balance a gate capacitance of the transmission gate portion.

14. The system of claim 13, wherein the balance capacitor has a capacitance value of about one-half the gate capacitance of the transmission gate portion.

15. The system of claim 9, wherein the logic enable portion controls the selectable current to each of the first and second drive lines based on one or more five volt input signals.

16. The system of claim 9, wherein the current distribution portion provides a constant current to the gate driver portion.

17. A quantum computer comprising:

two or more switchable control voltage sources each configured to generate a respective switchable control voltage signal;

a controller configured to control operation of each of the two or more switchable control voltage sources, and with which of the two or more switchable control voltage sources one or more switchable control electrodes are respectively in electrical communication; and a quantum object confinement apparatus comprising:

one or more electrode sequences, each electrode sequence comprising a respective plurality of control electrodes configured to control an electric potential in a respective trapping region of one or more trapping regions of the quantum object confinement apparatus, wherein a first switchable control electrode of the one or more switchable control electrodes of the respective plurality of control electrodes is configured to be switchably in electrical communication with a respective selected switchable control voltage source of the two or more switchable control voltage sources; and one or more switches, wherein each electrode sequence of the one or more electrode sequences is associated with a respective switch of the one or more switches and the respective switch is configured to control switching of the electrical communication of the one or more switchable control electrodes with the respective selected switchable control voltage sources of the two or more switchable voltage sources, where each of the one or more switches comprises:

a transmission gate portion comprising two transistors connected in series source-to-source or drain-to-drain, the transmission gate portion having a switch input terminal at one end and a switch output terminal at an opposite end, each of the two transistors having a gate, a source, and a drain;

a gate driver portion that detects a voltage at each of the switch input terminal and the switch output terminal and applies a bias voltage to the gates of the two transistors of the transmission gate portion, the applied bias voltage being a predetermined amount above a lesser or a greater of the voltage at the switch input terminal or the voltage at the switch output terminal;

a current distribution portion for providing a selectable current to each of a first drive line connected to the gates of the two transistors of the transmission gate portion and a second drive line; and a logic enable portion for controlling the selectable current to each of the first and second drive lines in response to first and second control signals received by the logic enable portion;

wherein the logic enable portion controls the selectable current to each of the first and second drive lines in response to the first control signal received by the logic enable portion such that a first voltage is applied to the gates of the two transistors of the transmission gate portion to turn the respective switch on such that a current flows through the two transistors of the transmission gate portion from the switch input terminal to the switch output terminal; and wherein the logic enable portion controls the selectable current to each of the first and second drive lines in response to the second control signal received by the logic enable portion such that a second voltage is applied to the gates of the two transistors of the transmission gate portion to turn the respective switch off such that substantially no current flows through the two transistors of the transmission gate portion from the switch input terminal to the switch output terminal.

18. The quantum computer of claim 17, wherein the two transistors of the transmission gate portion of each of the one or more switches are both a same type and size of transistor.

19. The quantum computer of claim 17, wherein the two transistors of the transmission gate portion of each of the one or more switches are both a p-type double-diffused metal-oxide-semiconductor (DMOS) transistor or both an n-type DMOS transistor.

20. The quantum computer of claim 17, wherein each of the one or more switches further comprises glitch cancelation circuitry connected between the switch output terminal and the second drive line;

wherein the glitch cancelation circuitry comprises a balance capacitor to balance a gate capacitance of the transmission gate portion; and wherein the balance capacitor has a capacitance value of about one-half the gate capacitance of the transmission gate portion.

* * * * *